United States Patent
El Haddad et al.

(10) Patent No.: US 12,244,309 B2
(45) Date of Patent: Mar. 4, 2025

(54) METHOD OF OPERATING A STORAGE DEVICE

(71) Applicant: STMicroelectronics (Grenoble 2) SAS, Grenoble (FR)

(72) Inventors: Elias El Haddad, Grenoble (FR); Tanguy Tromelin, Grenoble (FR); Patrick Bougant, Saint Egreve (FR); Christophe Matheron, Voreppe (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 18/402,958

(22) Filed: Jan. 3, 2024

(65) Prior Publication Data

US 2024/0137025 A1 Apr. 25, 2024
US 2024/0235555 A9 Jul. 11, 2024

Related U.S. Application Data

(63) Continuation of application No. 17/556,365, filed on Dec. 20, 2021, now Pat. No. 11,901,894, which is a continuation of application No. 16/951,645, filed on Nov. 18, 2020, now Pat. No. 11,211,932.

(30) Foreign Application Priority Data

Oct. 9, 2020 (FR) ...................................... 2010332

(51) Int. Cl.
H03K 19/173 (2006.01)
(52) U.S. Cl.
CPC ..... *H03K 19/1737* (2013.01); *H03K 19/1735* (2013.01)

(58) Field of Classification Search
None
See application file for complete search history.

(56) References Cited

U.S. PATENT DOCUMENTS

| | | | |
|---|---|---|---|
| 5,530,841 A | 6/1996 | Gregory | |
| 5,995,578 A | 11/1999 | Pau | |
| 6,777,977 B1 * | 8/2004 | Reynolds | H03K 19/1733 326/38 |
| 6,958,624 B1 * | 10/2005 | Starr | H03K 3/012 326/38 |

(Continued)

FOREIGN PATENT DOCUMENTS

EP 0224004 A2 10/1986

*Primary Examiner* — Jany Richardson
(74) *Attorney, Agent, or Firm* — Slater Matsil, LLP

(57) ABSTRACT

A device includes a first AND logic gate comprising a first input, a second input, and an output, a second AND logic gate comprising a first input, a second input, and an output, and a first OR logic gate comprising a first input coupled to the output of the first AND logic gate and a second input coupled to the output of the second AND logic gate. A first selection circuit has first and second data inputs, a first control input coupled to the first input of the first AND logic gate and a second control input coupled to the first input of the second AND logic gate. A first D latch includes a data input coupled to an output of the first selection circuit and an activation input coupled to an output of the first OR logic gate and a second D latch includes a data input coupled to the output of the first selection circuit and an activation input coupled to the output of the first OR logic gate.

20 Claims, 3 Drawing Sheets

(56) References Cited

U.S. PATENT DOCUMENTS

| | | | |
|---|---|---|---|
| 7,242,235 B1* | 7/2007 | Nguyen | H03K 3/0372 |
| | | | 327/210 |
| 9,385,724 B1* | 7/2016 | Schmit | H03K 19/17736 |
| 2002/0070775 A1* | 6/2002 | Chiu | G06F 30/3312 |
| | | | 327/141 |
| 2003/0177409 A1* | 9/2003 | Greenstreet | G06F 9/3869 |
| | | | 713/401 |
| 2013/0308373 A1* | 11/2013 | Shukh | G11C 14/0081 |
| | | | 365/158 |
| 2017/0063349 A1* | 3/2017 | Kim | H03K 3/037 |
| 2017/0133246 A1 | 5/2017 | Buller et al. | |
| 2017/0220519 A1 | 8/2017 | Spence et al. | |
| 2019/0199356 A1* | 6/2019 | Robin | H03K 23/505 |

* cited by examiner

METHOD OF OPERATING A STORAGE DEVICE

CROSS-REFERENCE TO RELATED APPLICATIONS

This application is a continuation application of U.S. application Ser. No. 17/556,365, filed on Dec. 20, 2021, which is a continuation application of U.S. application Ser. No. 16/951,645, filed on Nov. 18, 2020, now U.S. Pat. No. 11,211,932, issued on Dec. 28, 2021, which claims priority to French Patent Application No. 2010332, filed on Oct. 9, 2020, which applications are hereby incorporated herein by reference.

TECHNICAL FIELD

The present invention concerns, in general, storage devices. More particularly, it concerns storage devices using a latch or an asynchronous flip-flop.

BACKGROUND

A latch or an asynchronous flip-flop is a logic circuit capable, under certain circumstances, of maintaining the level of signals transmitted on its outputs despite changes in the level of the signals received on its inputs, in other words having a storage effect.

Latches are generally implemented in integrated circuit comprising a set of logic components aimed at producing one or more functions.

The integrated circuit is generally in the form of a solid rectangular box, equipped on one or more sides, or even on one face, with pins for establishing electrical connections with elements outside the box.

The various types of latch known include D latches. An example of this latch is shown in FIG. 1. It comprises an activation input G, a data input D and an output Q.

The inputs receive logic signals and the output transmits logic signals. Each logic signal is represented by an electrical signal that can take two levels, a high level ("high"="H") and a low-level ("low"="L"). In general, a signal is active when it is at a high level, and the signal is inactive when it is at a low level. Concerning reset signals, these signals are active when they are at a low level, and they are inactive when they are at a high level.

An active level is defined as being the level enabling the function allocated to the signal to be carried out. The high level is arbitrarily chosen as being the active level. It is then said that the signal is active. If the signal is at another level, the signal is said to be inactive. By simplification, a signal is said to be received when that signal is received at an active level, the signal is said to be transmitted when it is transmitted at an active level, the signal is said not to be received when it is received at an inactive level and it is said not to be transmitted or said that the transmission of the signal is stopped when it is transmitted at an inactive level.

The activation input G is configured to receive an activation signal. The data input D is configured to receive a data signal. The output Q is configured to transmit an output signal.

The operation of the D latch is as follows:
when the activation input G receives an active activation signal, the output Q transmits an output signal, the level of which varies identically with the variations in the data signal received at the data input D; and
when the activation input G receives an inactive activation signal, the output Q does not change the level of the transmitted output signal. The latter thus retains the level taken at the time when the activation signal passed from the active level to the inactive level.

It is therefore necessary to guarantee the stability of the activation signal G, in order to avoid storage of the data signal being carried out at the wrong time. Stability of the activation signal G is understood to mean that this signal must not comprise uncontrolled fluctuations between the active and inactive levels. These fluctuations are also known as "glitches."

In order to counter this problem, it is known to use flip-flop storage latches. These storage flip-flops comprise a synchronization input receiving a clock signal. In these storage flip-flops, the storage of the data signal level is performed at the time of a leading edge or trailing edge of the clock signal. Hence, any potential fluctuations in the activation signal do not impact on the operation of the flip-flop, as long as these fluctuations do not occur at the time of an edge of the clock signal.

However, these storage flip-flops have the disadvantage of requiring a larger space, in the integrated circuit, then the space necessary for latches.

There is therefore a need for a storage device which is not impacted by any potential undesired variations in the activation signal and for which the space occupied in the integrated circuit is limited.

SUMMARY

To this effect, the description discloses a storage device for a datum. The storage device comprises an AND logic gate comprising a first input configured to be connected to a third-party device and for receiving a selection signal, a second input configured to be connected to the third-party device and for receiving a status signal and an output configured to transmit an output signal when the selection signal and the status signal are received. The storage device also comprises a D latch capable of storing the datum and comprising an activation input connected to the output of the AND logic gate and a data input configured to be connected to the third-party device and for receiving a data signal. The data signal is representative of the datum and the D latch is configured to store the datum when it receives the output signal.

Thus, the storage device of the invention only allows the D latch to be activated when the selection signal transmitted by the third-party device is stable. This is carried out by the AND logic gate which receives the status signal and the selection signal as input, and which only transmits a signal on its output if these two received signals are active.

In one embodiment, the third-party device is a first third-party device, the AND logic gate is a first AND logic gate, the selection signal is a first selection signal, the status signal is a first status signal, the data signal is a first data signal and the output signal is a first output signal. The storage device further comprises a second AND logic gate comprising a first input, configured to be connected to a second third-party device and for receiving a second selection signal, a second input, configured to be connected to the second third-party device and for receiving a second status signal and an output, configured to transmit a second output signal when the second selection signal and the second status signal are received. The storage device further comprises an OR logic gate comprising a first input, a second input and an output. The output of the first AND logic gate is connected to the first input of the OR logic gate. The output of the second AND logic gate is connected to the second input of the OR logic gate. The output of the OR logic gate is connected to the activation input of the latch (VER1). The OR logic gate is configured to transmit a combined output signal when it receives a signal on its first input or on its second input. The D latch is configured to store the datum when it receives the combined output signal.

In one embodiment, the data signal is a first data signal, the storage device also comprises a selection device comprising data inputs, control inputs and a data output, the data output of the selection device being connected to the data input of the latch, a first control input of the control inputs of the selection device being configured to be connected to the first third-party device and for receiving the first selection signal, a second control input of the control inputs of the selection device being configured to be connected to the second third-party device and for receiving the second selection signal, a first data input of the data inputs of the selection device being configured to be connected to the first third-party device and for receiving the first data signal, a second data input of the data inputs of the selection device being configured to be connected to the second third-party device and for receiving a second data signal, the second data signal being representative of the datum, the selection device being configured to selectively connect the first data input or the second data input to the data output in such a way as to transmit, on the data input of the latch, the first data signal or the second data signal, as a function of the first selection signal and/or of the second selection signal.

In one embodiment, the OR logic gate being a first OR logic gate, the storage device further comprises a second OR logic gate comprising a first input, a second input and an output, the first input of the second OR logic gate being configured to be connected to an external output and for receiving a reset signal, the second input of the second OR logic gate being connected to the output of the first OR logic gate, the output of the second OR logic gate being connected to the activation input of the latch, the second OR logic gate being configured to transmit the output signal when it receives a signal on its first input or a signal on its second input, a third data input of the data inputs of the selection device being configured to be connected to the external output and for receiving the reset signal, a third control input of the control inputs of the selection device being configured to be connected to the external output and for receiving the reset signal, the selection device being configured to connect the third data input to its data output, when the third control input receives a reset signal.

In one embodiment, the latch is a first latch, the datum is a first datum, the first data signal is also representative of a second datum and the second data signal is also representative of the second datum, the storage device further comprising a second D latch capable of storing the second datum, the second latch comprising an activation input and a data input, the data input of the second latch being connected to the output of the selection device, the activation input of the second latch being connected to the output of the first OR logic gate.

In one embodiment, the latch is a first latch, the datum is a first datum, the first data signal is also representative of a second datum and the second data signal is also representative of the second datum, the storage device further comprising a second D latch capable of storing the second datum, the second latch comprising an activation input and a data input, the data input of the second latch being connected to the output of the selection device, the activation input of the second latch being connected to the output of the second OR logic gate.

For this purpose, according to another aspect of the invention, an integrated circuit is provided comprising an above-described storage device for a datum.

In one embodiment, the integrated circuit further comprises a third-party device connected to the storage device for the datum, the third-party device comprising a data output, configured to transmit a data signal representative of the datum, a selection output, configured to transmit a selection signal when the third-party device wishes to transmit the data signal and a status output, configured to transmit a status signal, when the selection signal is stable.

In one embodiment, the integrated circuit further comprises an external output, the external output being configured to transmit a reset signal.

For this purpose, according to another aspect of the invention, an electronic chip is provided comprising the above-described integrated circuit.

BRIEF DESCRIPTION OF THE DRAWINGS

Other features, aims and advantages of the invention will emerge from the following description, which is given purely by way of illustration and not being limiting and which should be read with reference to the attached drawings, in which.

DETAILED DESCRIPTION OF ILLUSTRATIVE EMBODIMENTS

It is specified that, in the figures, the solid squares represent an input or an output and the solid circles represent an electrical connection between two wires.

The inputs are indicated by a reference that starts with the digit "i" and the outputs by a reference that starts with the digit "2".

Figure 1:
FIG. 1, previously described, shows a latch of the prior art.
Figure 2:
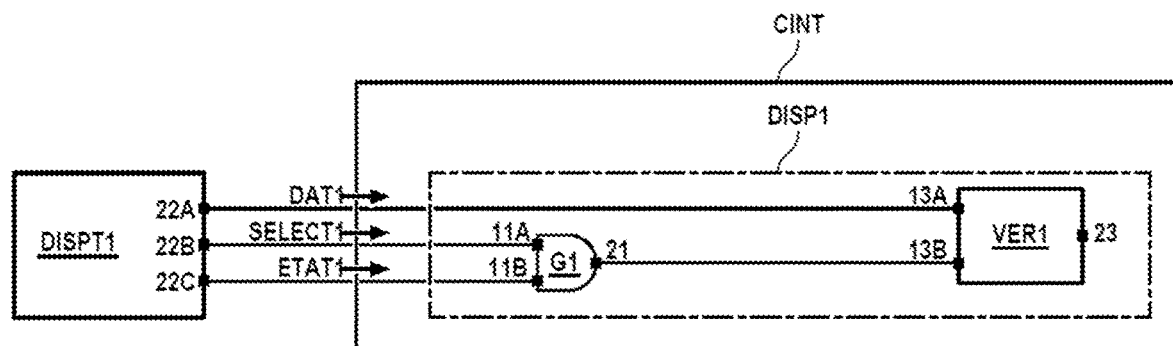
FIG. 2 shows an integrated circuit comprising the storage device of the invention.

FIG. 2 shows an integrated circuit CINT comprising a storage device DISP1 according to an embodiment of the invention. In FIG. 2, the storage device DISP1 has 1 bit of data and an address, and can be connected to a third-party device DISPT1.

The storage device DISP1 comprises a latch VER1 and an AND logic gate, referenced G1.

The latch VER1 comprises a data input 13A, an activation input 13B and a data output 23.

The AND logic gate G1 comprises a first input 11A, a second input 11B and an output 21. The logic gate G1 is configured so that the signal transmitted on the output 21 is active if the signal received on the input 11A and the signal received on the input 11B are active. In the case where only one of the received signals or none of the received signals is active, the signal transmitted on the output 21 is inactive.

When the latch VER1 receives, on its activation input 13B, an active signal originating from the logic gate G1, it is said that the latch is open.

The storage device DISP1 is connected to the third-party device DISPT1. This third-party device DISPT1 can be located in a part of the integrated circuit CINT or outside the integrated circuit CINT. When the third-party device DISPT1 is outside the integrated circuit, it can be connected via an MIPI (Mobile Industry Processor Interface) external communication interface, for example in accordance with the I2C (Inter-Integrated Circuit) or RFFE (RF front end) format. In this case, the signals received from the interface are to be decoded in the integrated circuit CINT. They can also be interfaces AMBA (Advanced Microcontroller Bus Architecture), APB (Advanced Peripheral Bus) communication interfaces or even dedicated IP interfaces. This third-party device DISPT1 comprises a data output 22A, a selection output 22B and a status output 22C. The data input 22A is configured to transmit a data signal DAT1. The selection output 22B is configured to transmit a selection signal SELECT1. The status output 22C is configured to transmit a status signal ETAT1.

The level of the data signal DAT1 is representative of the datum to be written in the storage device DISP1. Generally, an active level is representative of a 1 and an inactive level is representative of a 0. The selection signal SELECT1 is active when the third-party device DISPT1 wishes to write a datum in the storage device DISP1. The level of the status signal ETAT1 is representative of the stability of the selection signal SELECT1, in particular on the absence of fluctuation in this selection signal SELECT1. The status signal ETAT1 is generally active when the selection signal SELECT1 has no fluctuation.

The data input 13A of the latch VER1 is connected to the data output 22A of the third-party device DISPT1. The activation input 13B of the latch VER1 is connected to the output 21 of the logic gate G1. The first input 11A of the logic gate G1 is connected to the selection input 22B of the third-party device DISPT1. The second input 11B of the logic gate G1 is connected to the status output 22C of the third-party device DISPT1.

The reception of an active signal on the activation input 13B enables the opening of the latch VER1 and causes the fluctuation of the level of the signal transmitted on its output 23 as a function of the level of the signal received on its data input 13A.

In the storage device DISP1 of FIG. 2, the signal arriving on the activation input 13B of the latch VER1 will only be active if the selection signal SELECT1 and the status signal ETAT1 are active. In doing so, the latch VER1 will only be active if the selection signal SELECT1 transmitted by the third-party device DISPT1 is stable. Indeed, when the selection signal SELECT1 transmitted by the third-party device DISPT1 is not stable, the status signal ETAT1 is not at an active level and therefore the signal transmitted on the output 21 of the logic gate G1 and transmitted to the activation input 13B of the latch VER1 is not at an active level.

The storage device DISP1 of FIG. 2 thus makes it possible to be unimpacted by any possible perturbations of the signal enabling the activation of the latch. Moreover, it avoids the cluttering on the integrated circuit CINT linked to the use of a flip-flop.

Figure 3:
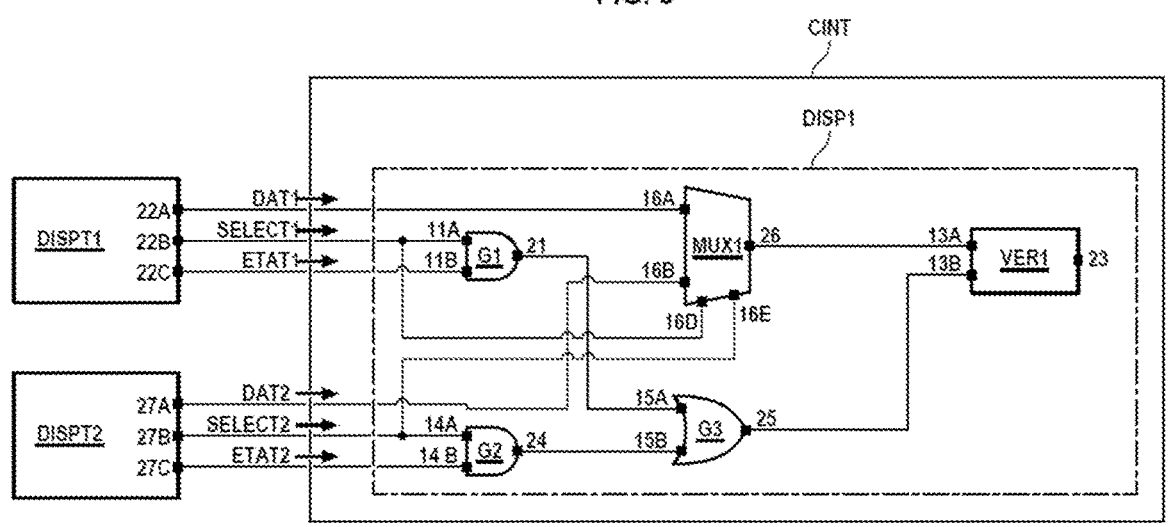
FIG. 3 shows, in another manner, the integrated circuit comprising the storage device of the invention.

FIG. 3 shows the integrated circuit CINT in another manner. In FIG. 3, the storage device DISP1 is configured to be connected to two third-party devices DISPT1 and DISPT2. These third-party devices DISPT1, DISPT2 can be located in a part of the integrated circuit CINT or outside of the integrated circuit CINT. The storage device DISP1 has 1 bit of data and an address. The other third-party device DISPT2 is identical to the third-party device DISPT1 described in FIG. 2. It thus comprises a data output 27A, a selection output 27B and a status output 27C. The data input 27A is configured to transmit a data signal DAT2. The selection output 27B is configured to transmit a selection signal SELECT2. The status output 27C is configured to transmit a status signal ETAT2.

The third-party devices DISPT1 and DISPT2 can operate asynchronously.

Similarly, for the third-party device DISPT1, the level of the data signal DAT2 is representative of the datum to be written in the storage device. Generally, an active level is representative of a 1 and an inactive level is representative of a 0. The selection signal SELECT2 is active when the third-party device DISPT2 wishes to write a datum in the storage device. The level of the status signal ETAT2 is representative of the stability of the selection signal SELECT2, in particular on the absence of fluctuation in this selection signal SELECT2. The status signal ETAT2 is generally active when the selection signal SELECT2 has no fluctuation.

The storage device DISP1 as described in FIG. 3 comprises a second AND logic gate G2. This second logic gate G2 is identical to the logic gate G1. It comprises a first input 14A, a second input 14B and an output 24. It is configured so that the signal transmitted on the output 24 is active if the signal received on the input 14A is active and the signal received on the input 14B is active. In the case where only one of the received signals or none of the received signals is active, the signal transmitted on the output 24 is inactive.

The storage device comprises an OR logic gate G3. The logic gate comprises a first input 15A, a second input 15B and an output 25. This logic gate G3 is configured so that the signal transmitted on the output 25 is active in the case where one or more other of the signals received on the first input 15A or the second input 15B is active. This logic gate G3 is placed between the logic gate G1 and the latch VER1.

The selection output 27B of the third-party device DISPT2 is connected to the first input 14A of the logic gate G2. The status output 27C of the third-party device DISPT2 is connected to the second input 14 B of the logic gate G2.

Thus, the signal transmitted at the output of the logic gate G2 is active if the selection signal SELECT2 and the status signal ETAT2 are active. Thus, this output signal transmitted by the logic gate G2 is inactive as long as the selection signal SELECT2 transmitted by the third-party device DISPT2 is not stable.

The first input 15A of the logic gate G3 is connected to the output 21 of the logic gate G1. The second input 15B of the logic gate G3 is connected to the output 24 of the logic gate G2. The output 25 of the logic gate G3 is connected to the activation input 13B of the latch VER1.

The signal received by the latch VER1 on its activation input 13B is therefore active if the signal transmitted by the logic gate G1 or the signal transmitted by the logic gate G2 on their respective output 21 and 24 is active. In all cases, if the status signal ETAT1 transmitted by the third-party device DISPT1 or the status signal ETAT2 transmitted by the device DISPT2 is not active, then the signal received on the activation input 13B of the latch VER1 will not be active.

The storage device of FIG. 3 also comprises a selection device MUX1. This selection device MUX1 comprises a first data input 16A, a second data input 16B, a first control input 16D, a second control input 16E and an output 26. This selection device MUX1 is configured to selectively connect the first input 16A or the first input 16B to the output 26. This connection selectivity is carried out as a function of the status signals received on the first control input 16D and on the second control input 16E.

The selection device MUX1 is configured to connect the first data input 16A to the output 26 as long as the signal received on the first control input 16D is active. The selection device MUX1 is configured to connect the second data input 16B to the output 26, if the signal received on the second control input 16E is active and the signal received on the first control input 16D is inactive. There is therefore a priority of the third-party device DISPT1 over the third-party device DISPT2, when the two third-party devices DISPT1 and DISPT2 wish to concurrently access the latch VER1. In other embodiments, an inverse priority can be realized.

Figure 4:
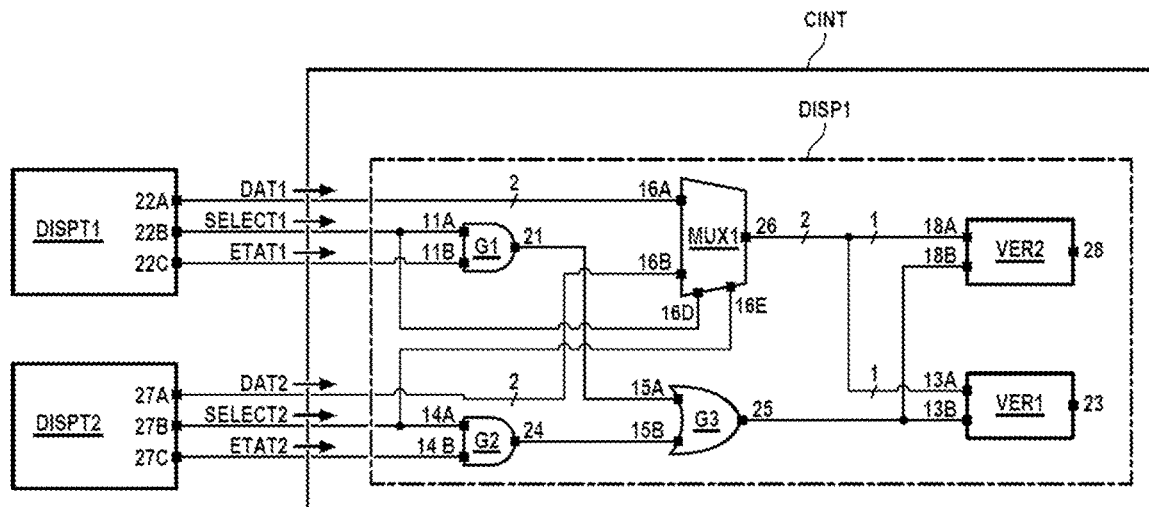
FIG. 4 shows, in another manner, the integrated circuit comprising the storage device of the invention.

FIG. 4 shows the integrated circuit CINT comprising the storage device DISP1 in an embodiment where it comprises another latch VER2. The latch VER2 is identical to the latch VER1 and comprises a data input 18A, an activation input 18B and a data output 28. The storage device DISP1 has 2 data bits and an address, and can be connected to two third-party devices DISPT1 and DISPT2.

The third-party devices DISPT1 and DISPT2 can operate asynchronously.

The activation input 18B of the latch VER2 is connected to the output 25 of the logic gate G3. The data input 18A of the latch VER2 is connected to the output 26 of the selection device MUX1.

In this case, the data output 22A of the third-party device DISPT1 and the data output 27A of the third-party device DISPT2 are data bus outputs. These outputs comprise a plurality of wires enabling the transmission of a plurality of data signals, each data signal being intended for one or other of the latches VER1 or VER2 and being representative of a datum to be stored by one or other of the latches VER1 or VER2. As shown in FIG. 4, the bus of the data output 22A and of the data output 27A each comprise two wires.

The first input 16A and the second input 16B of the selection device MUX1 are a bus configured to receive, in parallel, a plurality of data signals. As shown in FIG. 4, the bus of the first input 16A and the bus of the second input 16B each comprise two wires. The output 26 of the selection device MUX1 is also a bus which enables the transmission of a plurality of data signals. As shown in FIG. 4, the bus of the output 26 comprises two wires. This bus of the output 26 then separates into two connections which comprise only a single wire and which are respectively connected to the data input 13A of the latch VER1 and to the data input 18A of the latch VER2.

Figure 5:
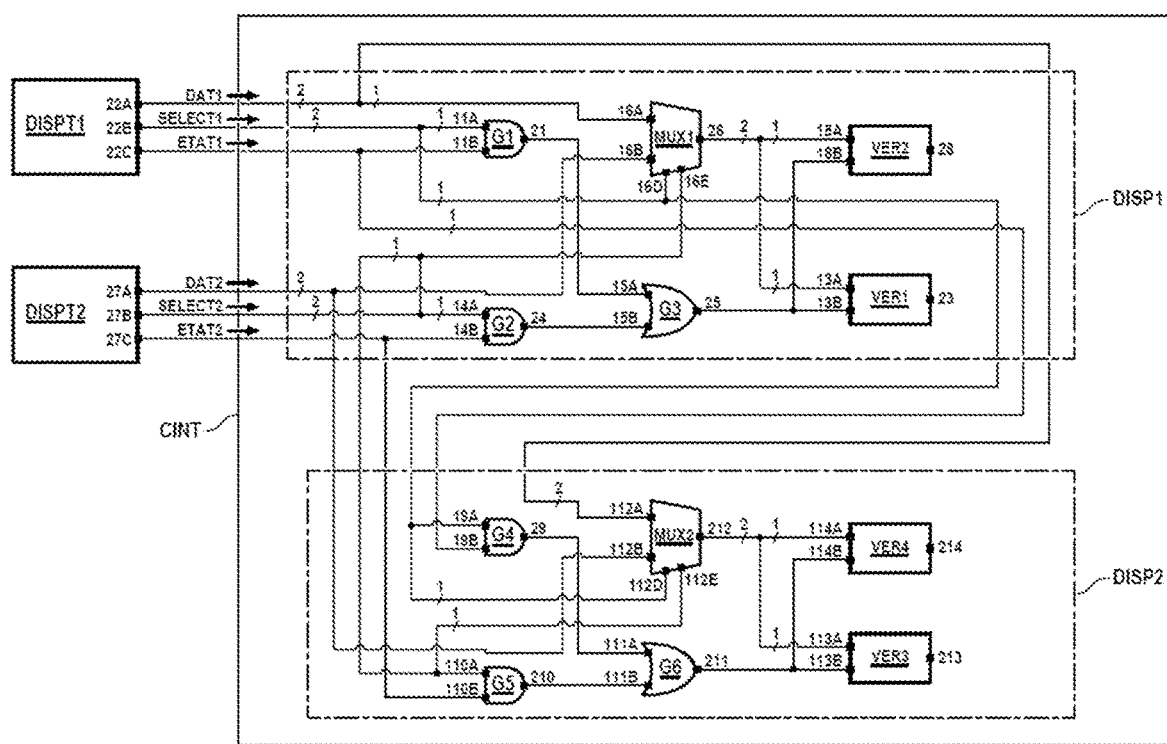
FIG. 5 shows the integrated circuit comprising two storage devices of the invention.

FIG. 5 shows the integrated circuit CINT comprising two storage devices DISP1 and DISP2. The integrated circuit CINT is connected to two third-party devices DISPT1 and DISPT2. The second storage device DISP2, described in FIG. 5, comprises the same elements as storage device DISP1. The storage device DISP1 has two data bits, has two addresses and can be connected to two third-party devices DISPT1 and DISPT2. These third-party devices DISPT1 and DISPT2 can be located in a part of the integrated circuit CINT or outside the integrated circuit CINT.

The third-party devices DISPT1 and DISPT2 can operate asynchronously.

In particular, the storage device DISP2 comprises two AND logic gates G4 and G5, a selection device MUX2, an OR logic gate G6 and two latches VER3 and VER4.

The logic gate G4 comprises a first input 19A, a second input 19B and an output 29.

The logic gate G5 comprises a first input 110A, a second input 110B and an output 210.

The logic gate G6 comprises a first input 111A, a second input 111B and an output 211.

This selection device MUX2 comprises a first data input 112A, a second data input 112B, a first control input 112D, a second control input 112E and an output 212. This selection device MUX2 has an identical operation to the operation of the selection device MUX1. The selection device MUX2 is configured to selectively connect the first input 16A or the first input 16B to the output 26. This connection selectivity is carried out as a function of the status signals received on the first control input 16D and on the second control input 16E.

The latch VER3 comprises a data input 113A, an activation input 113B and a data output 213.

The latch VER4 comprises a data input 114A, an activation input 114B and a data output 214.

The first input 19A of the logic gate G4 is connected to the selection output 22B of the third-party device DISPT1. The second input 19B of the logic gate G4 is connected to the status output 22C of the third-party device DISPT1. The output 29 of the logic gate G4 is connected to the first input 111A of the logic gate G6.

The first input 110A of the logic gate G5 is connected to the selection output 27B of the third-party device DISPT2. The second input 110B of the logic gate G5 is connected to the status output 27C of the third-party device DISPT2. The output 210 of the logic gate G4 is connected to the first input 111B of the logic gate G6.

The output 211 of the logic gate G6 is connected to the activation input 113B of the latch VER3 and to the activation input 114B of the latch VER4.

The first data input 112A of the selection device MUX2 is connected to the data output 22A of the third-party device DISPT1. The second data input 112B of the selection device MUX2 is connected to the data output 27A of the third-party device DISPT2. The first control input 112D of the selection device MUX2 is connected to the selection output 22B of the third-party device DISPT1. The second control input 112E of the selection device MUX2 is connected to the selection output 27B of the third-party device DISPT2. The data output 212 of the selection device MUX2 is connected to the data input 113A of the latch VER3 to the data input 114A of the latch VER4.

The third-party devices DISPT1 and DISPT2 can simultaneously and independently access the storage device DISP1 and DISP2. Here, there is a register bank with 2 addresses. DISPT1 can access DISP1 (@ox1) or DISP2 (@ox2) while DISPT2 accesses the other.

The data output 22A of the third-party device DISPT1 and the data output 27A of the third-party device DISPT2 are data bus outputs. As shown in FIG. 5, the bus of the data output 22A and of the data output 27A each comprise two wires.

Similarly, the selection output 22B of the third-party device DISPT1 and the selection output 27B of the third-party device DISPT2 are data bus outputs. As shown in FIG. 5, the buses of the selection output 22B and of the selection output 27B each comprise two wires. Each wire is associated with one or other of the storage devices DISP1 and DISP2 and comprises a selection signal intended for one or other of the storage devices DISP1 and DISP2.

Hence, the selection output 22B enables the transmission of two selection signals. Then, the two wires of the bus of the selection output 22B are separated. One wire is connected to the storage device DISP1 (more particularly to the input 11A of logic gate G1 and to the control input 16D of the selection device MUX1), in order to transmit the selection signal to the storage device DISP1. The other wire is connected to the storage device DISP2 (more particularly to the input 19A of logic gate G4 and to the control input 112D of the selection device MUX2), in order to transmit the selection signal to the storage device DISP2.

In an identical manner, the selection output 27B enables the transmission of two selection signals. Then, the two wires of the bus of the selection output 27B are separated. One wire is connected to the storage device DISP1 (more particularly to the input 14A of logic gate G2 and to the control input 16E of the selection device MUX1), in order to transmit the selection signal to the storage device DISP1. The other wire is connected to the storage device DISP2 (more particularly to the input 110A of logic gate G5 and to the control input 112E of the selection device MUX2), in order to transmit the selection signal to the storage device DISP2.

The first input 16A and the second input 16B of the selection device MUX1 are a bus configured to receive, in parallel, a plurality of data signals. As shown in FIG. 5, the bus of the first input 16A and the bus of the second input 16B each comprise two wires. The output 26 of the selection device MUX1 is also a bus which enables the transmission of a plurality of data signals. As shown in FIG. 5, the bus of the output 26 comprises two wires. This bus of the output 26 then separates into two connections which comprise only a single wire and which are respectively connected to the data input 13A of the latch VER1 and to the data input 18A of the latch VER2.

The first input 112A and the second input 112B of the selection device MUX2 are a bus configured to receive, in parallel, a plurality of data signals. As shown in FIG. 5, the bus of the first input 112A and the bus of the second input 112B each comprise two wires. The output 212 of the selection device MUX2 is also a bus which enables the transmission of a plurality of data signals. As shown in FIG. 5, the bus of the output 212 comprises two wires. This bus of the output 212 then separates into two connections which comprise only a single wire and which are respectively connected to the data input 113A of the latch VER3 and to the data input 114A of the latch VER4.

Figure 6:
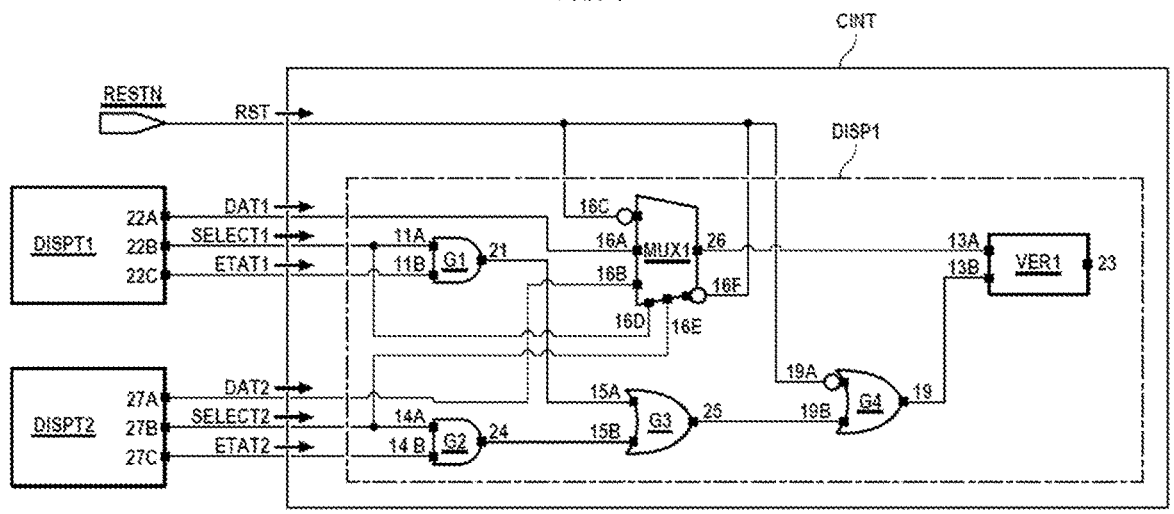
FIG. 6 shows, in another manner, the integrated circuit comprising the storage device of the invention.

FIG. 6 shows the integrated circuit CINT configured to be connected to an external output RESET, this external output RESET being able to transmit a reset signal RST. The storage device DISP1 it is also configured to be connected to the external output RESET. The third-party devices DISPT1 and DISPT2 can be located in a part of the integrated circuit CINT or outside the integrated circuit CINT. The storage device DISP1 has 1 data bit and an address, can be connected to two third-party devices DISPT1 and DISPT2 and can be reset.

The third-party devices DISPT1 and DISPT2 can operate asynchronously.

As shown in FIG. 6, the storage device DISP1 comprises an OR logic gate G4. This logic gate G4 is placed between the logic gate G3 and the latch VER1. This logic gate G4, like the logic gate G3, comprises a first input 19A, a second input 19B and an output 29. Advantageously, the first input 19A is an inverting input, because the reset signal RST is active when it is low level. The logic gate G4 is configured so that, when the signal received on the first input 19A or on the second input 19B is active, then the signal transmitted on the output 19 is active. Thus, when the reset signal RST is active, the signal transmitted by the logic gate G4 on its output 19 is active. This active signal received by the latch VER1 on its input 13B activates the latch VER1.

The selection device MUX1 comprises a third data input 16C and a third control input 16F. The third data input 16C and the third control input 16F are inverting inputs. The third data input 16C and the third control input 16F are connected to the external output RESET, in order to receive the reset signal RST. The selection device MUX1 is configured so that, on reception of an active signal on the third control input 16F, its output 26 its connected to the third data input 16C. Thus, when the active reset signal RST is transmitted by the reset output, the output 26 of the selection device MUX1 transmits an active signal. The reception of this active signal received by the data input 13A of the latch VER1, coupled with the reception of an active signal on the activation input 13B of the latch VER1, causes the latch VER1 to be set to 1.

Figure 7:
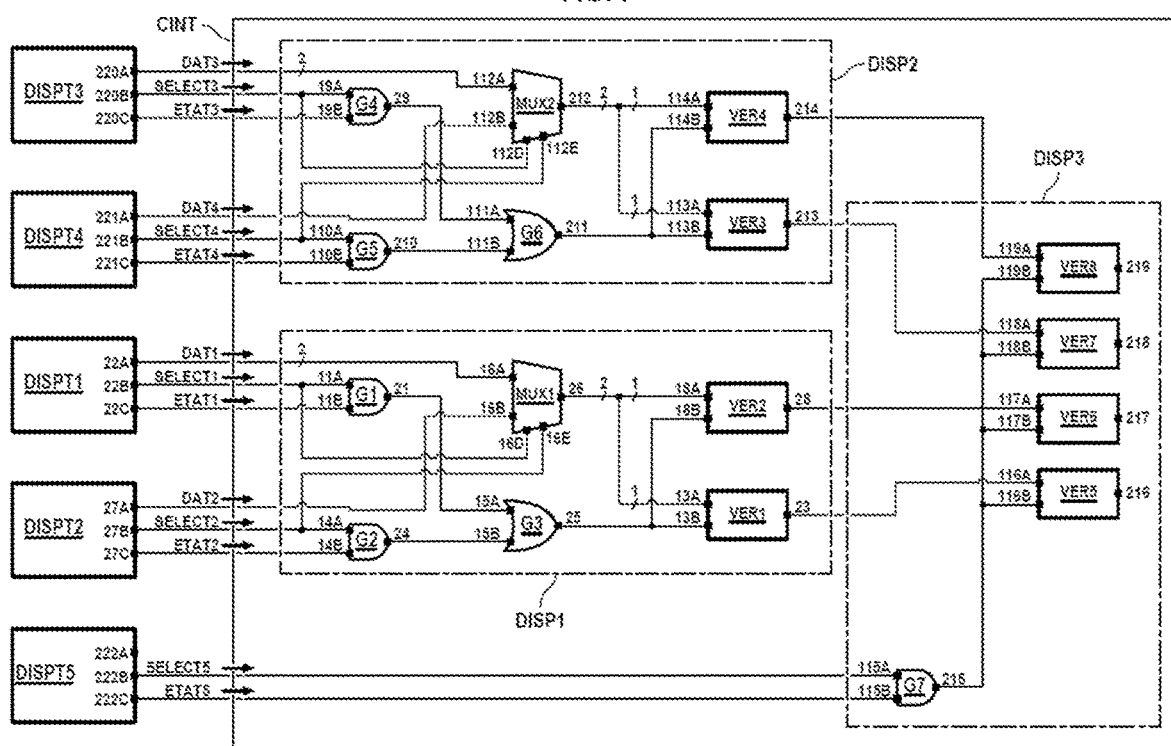
FIG. 7 shows the integrated circuit comprising three storage devices of the invention.

FIG. 7 shows the integrated circuit CINT in an embodiment where it comprises three storage devices DISP1, DISP2 and DISP 3. The storage devices DISP1 and DISP2 are identical to each other and are identical to the storage device DISP1 shown in FIG. 3. In this figure, the storage devices DISP1 and DISP2 are shadow registers.

The integrated circuit CINT is connected to five third-party devices DISPT1 to DISPT5. The third-party devices DISPT1 to DISPT2 can be located in a part of the integrated circuit CINT or outside the integrated circuit CINT. The third-party devices DISPT1 to DISPT5 are identical to one another and are identical to the third-party device DISPT1 of FIG. 2. The storage device DISP1 is connected to the third-party devices DISPT1 and DISPT2. The storage device DISP2 is connected to the third-party device DISPT3 and DISPT4. The storage device DISP3 is connected to the third-party device DISPT5.

The third-party devices DISPT1 to DISPT5 can operate asynchronously.

The third-party device DISPT3 comprises a data output 220A, a selection output 220B and a status output 220C. The data output 220A is configured to transmit a data signal DAT3. The selection output 220B is configured to transmit a selection signal SELECT3. The status output 220C is configured to transmit a status signal ETAT3.

The third-party device DISPT4 comprises a data output 221A, a selection output 221B and a status output 221C. The data output 221A is configured to transmit a data signal DAT4. The selection output 221B is configured to transmit a selection signal SELECT4. The status output 221C is configured to transmit a status signal ETAT4.

The third-party device DISPT5 comprises a data output 222A, a selection output 222B and a status output 222C. The data output 222A is configured to transmit a data signal (not shown in FIG. 7). The selection output 222B is configured to transmit a selection signal SELECT5. The status output 222C is configured to transmit a status signal ETAT5.

In FIG. 7, the selection output 220B of the third-party device DISPT3 is connected to the first input 19A of the logic gate G4. The selection output 220B of the third-party device DISPT3 is also connected to the first control input 112D of the selection device MUX2. The status output 220C of the third-party device DISPT3 is connected to the second input 19B of the logic gate G4. The data output 220A of the third-party device DISPT3 is connected to the first control input 112A of the selection device MUX2.

The internal connections of the storage device DISP1 and of the storage device DISP2, as shown in FIG. 7, are identical to the internal connections of the storage device DISP1 and of the storage device DISP2, as shown in FIG. 5.

The storage device DISP3 comprises an AND logic gate G7 and four latches VER5 to VER8.

The logic gate G7 comprises a first input 115A, a second input 115B and an output 215.

Each of the latches VER1 to VER5 comprises an activation input (116A to 119A respectively), a data input (116B to 119B respectively) and an output (216 to 219 respectively).

The first input 115A of the logic flip-flop G7 is connected to the selection output 222B of the third-party device DISPT5. The second input 115B of the logic flip-flop G7 is connected to the status output 222C of the third-party device DISPT5. The output 215 of the logic gate G7 is connected to all of the selection inputs (116B to 119B) of the latches VER5 to VER8.

The data output 23 of the latch VER1 is connected to the data input 116A of the latch VER5. The output 28 of the latch VER2 is connected to the data input 117A of the latch VER6. The output 213 of the latch VER3 is connected to the input 118A of the latch VER7. The output 214 of the latch VER4 is connected to the data input 119 of the latch VER8.

As shown in FIG. 7, the integrated circuit CINT operates in two steps. In a first step, data are stored in the latches VER1 to VER4. These data originate from the third-party devices DISPT1 to DISPT4. Then, when the data are correctly stored in the latches VER1 to VER4, the third-party device DISPT5 activates the storage of the data to the latches VER5 to VER8. This activation is carried out through the use of a single logic gate, the logic gate G7 sending an active signal on the activation inputs 116B to 119B of the latches VER5 to VER8. This storage is carried out when the selection signal SELECT5 and the status signal ETAT5 are active, which allows the signal transmitted on the output 115 of the logic gate G7 to be active, which has the effect of activating the latches VER5 to VER8.

The data output 22A of the third-party device DISPT1, the data output 27A of the third-party device DISPT2, the data output 220A of the third-party device DISPT3 and the data output 221A of the third-party device DISPT4 are data bus outputs. As shown in FIG. 7, the bus of data output 22A, of data output 27A, of data output 220A and of data output 221A each comprise two wires.

The first input 16A and the second input 16B of the selection device MUX1 are a bus configured to receive, in parallel, a plurality of data signals. As shown in FIG. 5, the bus of the first input 16A and the bus of the second input 16B each comprise two wires. The output 26 of the selection device MUX1 is also a bus which enables the transmission of a plurality of data signals. As shown in FIG. 5, the bus of the output 26 comprises two wires. This bus of the output 26 then separates into two connections which comprise only a single wire and which are respectively connected to the data input 13A of the latch VER1 and to the data input 18A of the latch VER2.

The first input 112A and the second input 112B of the selection device MUX2 are a bus configured to receive, in parallel, a plurality of data signals. As shown in FIG. 5, the bus of the first input 112A and the bus of the second input 112B each comprise two wires. The output 212 of the selection device MUX2 is also a bus which enables the transmission of a plurality of data signals. As shown in FIG. 5, the bus of the output 212 comprises two wires. This bus of the output 212 then separates into two connections which comprise only a single wire and which are respectively connected to the data input 113A of the latch VER3 and to the data input 114A of the latch VER4.

What is claimed is:

1. A device comprising:
   a first AND logic gate comprising a first input, a second input, and an output;
   a second AND logic gate comprising a first input, a second input, and an output;
   a first OR logic gate comprising a first input coupled to the output of the first AND logic gate and a second input coupled to the output of the second AND logic gate;
   a first selection circuit having first and second data inputs, a first control input coupled to the first input of the first AND logic gate and a second control input coupled to the first input of the second AND logic gate;
   a first D latch comprising a data input coupled to an output of the first selection circuit and an activation input coupled to an output of the first OR logic gate; and
   a second D latch comprising a data input coupled to the output of the first selection circuit and an activation input coupled to the output of the first OR logic gate.

2. The device according to claim 1, wherein:
   the first input of the first AND logic gate is configured to be coupled to a select output of a first third-party device;
   the second input of the first AND logic gate is configured to be coupled to a status signal output of the first third-party device;
   the first input of the second AND logic gate is configured to be coupled to a select output of a second third-party device;
   the second input of the second AND logic gate is configured to be coupled to a status signal output of the second third-party device;
   the first data input of the first selection circuit is configured to be coupled to a data output of the first third-party device; and
   the second data input of the first selection circuit is configured to be coupled to a data output of the second third-party device.

3. The device according to claim 1, further comprising:
   a third AND logic gate comprising a first input coupled to the first input of the first AND logic gate, a second input coupled to the second input of the first AND logic gate, and an output;
   a fourth AND logic gate comprising a first input coupled to the first input of the second AND logic gate, a second input coupled to the second input of the second AND logic gate, and an output;
   a second OR logic gate comprising a first input coupled to the output of the third AND logic gate and a second input coupled to the output of the fourth AND logic gate;
   a second selection circuit having first and second data inputs, a first control input coupled to the first input of the third AND logic gate and a second control input coupled to the first input of the fourth AND logic gate;
   a third D latch comprising a data input coupled to an output of the second selection circuit and an activation input coupled to an output of the second OR logic gate; and
   a fourth D latch comprising a data input coupled to the output of the second selection circuit and an activation input coupled to the output of the second OR logic gate.

4. The device according to claim 3, further comprising:
a first third-party device having a first output coupled to the first input of the first AND logic gate and to the first input of the third AND logic gate and a second output coupled to the second input of the first AND logic gate and to the second input of the second AND logic gate; and
a second third-party device having a first output coupled to the first input of the second AND logic gate and to the first input of the fourth AND logic gate and a second output coupled to the second input of the second AND logic gate and to second input of the fourth AND logic gate.

5. The device according to claim 1, further comprising:
a first third-party device having a first output coupled to the first input of the first AND logic gate and a second output coupled to the second input of the first AND logic gate; and
a second third-party device having a first output coupled to the first input of the second AND logic gate and a second output coupled to the second input of the second AND logic gate.

6. The device according to claim 5, wherein the first AND logic gate, the second AND logic gate, the first OR logic gate, the first selection circuit, the first D latch, the second D latch, the first third-party device, and the second third-party device are integrated in a single integrated circuit.

7. The device according to claim 5, wherein the first AND logic gate, the second AND logic gate, the first OR logic gate, the first selection circuit, the first D latch, and the second D latch are integrated in a first integrated circuit and the first third-party device and the second third-party device are integrated in a second integrated circuit, wherein the first integrated circuit and the second integrated circuit are functionally coupled by a communication interface.

8. The device according to claim 1, further comprising a second OR logic gate comprising a first input coupled to a third data input of the first selection circuit, a second input coupled to the output of the first OR logic gate, and an output coupled to the activation input of the first D latch.

9. The device according to claim 8, wherein the first input of the second OR logic gate is configured to be coupled to a reset signal.

10. The device according to claim 1, wherein the first OR logic gate is configured to transmit an output signal in response to a signal on the first input or on the second input of the first OR logic gate and wherein the first D latch is configured to store datum in response to the output signal.

11. The device according to claim 1, wherein the first selection circuit is configured to selectively connect data from a first third-party device or data from a second third-party device to the first D latch and the second D latch.

12. A storage device comprising:
a first AND logic gate comprising a first input configured to be coupled to a first third-party device to receive a first selection signal, a second input configured to be coupled to the first third-party device to receive a first status signal, and an output configured to transmit a first output signal when the first selection signal and the first status signal are received;
a second AND logic gate comprising a first input configured to be coupled to a second third-party device to receive a second selection signal, a second input configured to be coupled to the second third-party device to receive a second status signal, and an output configured to transmit a second output signal when the second selection signal and the second status signal are received;
a first OR logic gate comprising a first input coupled to the output of the first AND logic gate, a second input coupled to the output of the second AND logic gate, and an output;
a selection circuit comprising a first control input configured to be coupled to receive the first select signal of the first third-party device, a second control input configured to be coupled to receive the second select signal of the second third-party device, a first data input configured to be coupled to receive a first data signal of the first third-party device, a second data input configured to be coupled to receive a second data signal of the second third-party device;
a first D latch comprising an activation input coupled to the output of the first OR logic gate and a data input coupled to an output of the selection circuit to receive the first data signal from the first third-party device or the second data signal from the second third-party device; and
a second D latch comprising an activation input coupled to the output of the first OR logic gate and a data input coupled to the output of the selection circuit to receive the first data signal from the first third-party device or the second data signal from the second third-party device.

13. The storage device according to claim 12, further comprising a second OR logic gate comprising a first input coupled to an external reset line to receive a reset signal, a second input coupled to the output of the first OR logic gate, and an output coupled to the activation input of the first D latch.

14. A device comprising:
a first AND logic gate comprising a first input, a second input, and an output;
a second AND logic gate comprising a first input, a second input, and an output;
a first OR logic gate comprising a first input coupled to the output of the first AND logic gate and a second input coupled to the output of the second AND logic gate;
a first selection circuit having first and second data inputs, a first control input coupled to the first input of the first AND logic gate and a second control input coupled to the first input of the second AND logic gate;
a first D latch comprising a data input coupled to an output of the first selection circuit and an activation input coupled to an output of the first OR logic gate;
a second D latch comprising a data input coupled to the output of the first selection circuit and an activation input coupled to the output of the first OR logic gate;
a third AND logic gate comprising a first input, a second input, and an output;
a fourth AND logic gate comprising a first input, a second input, and an output;
a second OR logic gate comprising a first input coupled to the output of the third AND logic gate and a second input coupled to the output of the fourth AND logic gate;
a second selection circuit having first and second data inputs, a first control input coupled to the first input of the third AND logic gate and a second control input coupled to the first input of the fourth AND logic gate;

a third D latch comprising a data input coupled to an output of the second selection circuit and an activation input coupled to an output of the second OR logic gate; and a fourth D latch comprising a data input coupled to the output of the second selection circuit and an activation input coupled to the output of the second OR logic gate;

a fifth D latch comprising a data input coupled to an output of the first D latch;

a sixth D latch comprising a data input coupled to an output of the second D latch;

a seventh D latch comprising a data input coupled to an output of the third D latch; and an eighth D latch comprising a data input coupled to an output of the fourth D latch.

15. The device according to claim 14, wherein:

the first input of the first AND logic gate is configured to be coupled to a select output of a first third-party device;

the second input of the first AND logic gate is configured to be coupled to a status signal output of the first third-party device;

the first input of the second AND logic gate is configured to be coupled to a select output of a second third-party device;

the second input of the second AND logic gate is configured to be coupled to a status signal output of the second third-party device;

the first data input of the first selection circuit is configured to be coupled to a data output of the first third-party device;

the second data input of the first selection circuit is configured to be coupled to a data output of the second third-party device;

the first input of the third AND logic gate is configured to be coupled to a select output of a third third-party device;

the second input of the third AND logic gate is configured to be coupled to a status signal output of the third third-party device;

the first input of the fourth AND logic gate is configured to be coupled to a select output of a fourth third-party device;

the second input of the fourth AND logic gate is configured to be coupled to a status signal output of the fourth third-party device;

the first data input of the second selection circuit is configured to be coupled to a data output of the third third-party device; and the second data input of the second selection circuit is configured to be coupled to a data output of the fourth third-party device.

16. The device according to claim 15, further comprising a fifth AND logic gate having a first input configured to be coupled to a select output of a fifth third-party device, a second input configured to be coupled to a data output of the fifth third-party device; and an output coupled to data inputs of the fifth, sixth, seventh and eighth D latches.

17. The device according to claim 14, further comprising a fifth AND logic gate having an output coupled to data inputs of the fifth, sixth, seventh and eighth D latches.

18. The device according to claim 14, further comprising:

a first third-party device having a first output coupled to the first input of the first AND logic gate, a second output coupled to the second input of the first AND logic gate, and a third output coupled to the first data input of the first selection circuit;

a second third-party device having a first output coupled to the first input of the second AND logic gate, a second output coupled to the second input of the second AND logic gate, and a third output coupled to the second data input of the first selection circuit;

a third third-party device having a first output coupled to the first input of the third AND logic gate, a second output coupled to the second input of the third AND logic gate, and a third output coupled to the first data input of the second selection circuit; and a fourth third-party device having a first output coupled to the first input of the fourth AND logic gate, a second output coupled to the second input of the fourth AND logic gate, and a third output coupled to the second data input of the second selection circuit.

19. The device according to claim 18, further comprising:

a fifth third-party device; and a fifth AND logic gate having a first input coupled to a first output of the fifth third-party device, a second input coupled to a second output of the fifth third-party device, and an output coupled to data inputs of the fifth, sixth, seventh and eighth D latches.

20. The device according to claim 14, further comprising:

a first third-party device having a select output coupled to the first input of the first AND logic gate, a status output coupled to the second input of the first AND logic gate, and a data output coupled to the first data input of the first selection circuit;

a second third-party device having a select output coupled to the first input of the second AND logic gate, a status output coupled to the second input of the second AND logic gate, and a data output coupled to the second data input of the first selection circuit;

a third third-party device having a select output coupled to the first input of the third AND logic gate, a status output coupled to the second input of the third AND logic gate, and a data output coupled to the first data input of the second selection circuit; and a fourth third-party device having a select output coupled to the first input of the fourth AND logic gate, a status output coupled to the second input of the fourth AND logic gate, and a data output coupled to the second data input of the second selection circuit.

\* \* \* \* \*